Figure 1:
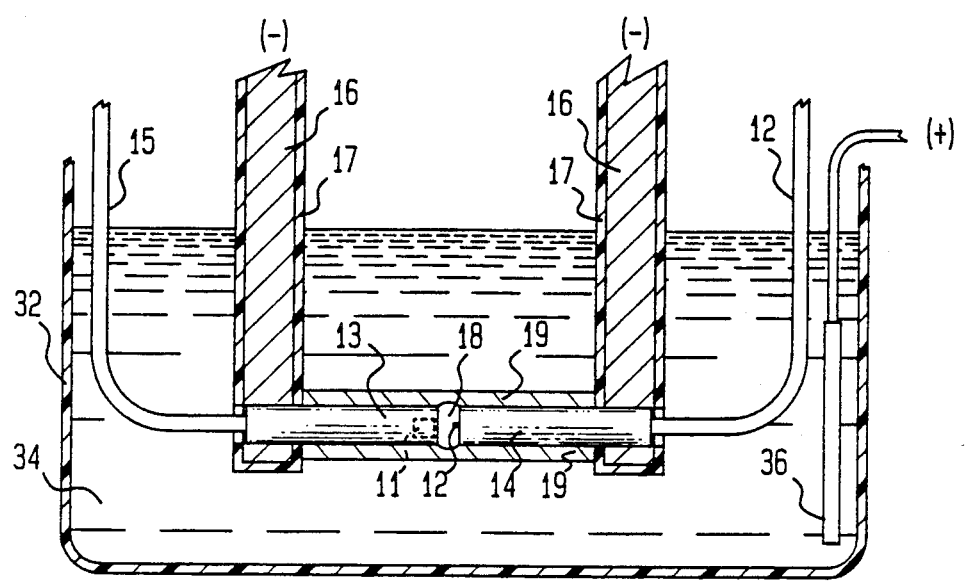

United States Patent [19]

Ladany

[11] Patent Number: 5,048,919

[45] Date of Patent: Sep. 17, 1991

[54] LOW-STRESS COUPLING OF ELECTROOPTICAL DEVICE TO OPTICAL FIBER

[75] Inventor: Ivan Ladany, Harborton, Va.

[73] Assignee: Bell Communications Research, Inc., Livingston, N.J.

[21] Appl. No.: 593,787

[22] Filed: Oct. 5, 1990

[51] Int. Cl.$^5$ .............................................. G02B 6/30
[52] U.S. Cl. ...................................... 385/49; 357/74; 403/344; 204/16; 204/25; 385/51
[58] Field of Search ..................... 350/96.2, 21, 22, 15, 350/17; 357/30, 74, 1, 81, 17; 204/14.1, 16, 25; 403/341, 344; 250/227.11, 227.28, 227.14

[56] References Cited

U.S. PATENT DOCUMENTS

| | | | |
|---|---|---|---|
| 3,878,397 | 4/1975 | Robb et al. | 250/551 |
| 3,932,761 | 1/1976 | Ramsey et al. | 250/552 |
| 4,616,899 | 10/1986 | Schlefer | 350/96.18 |
| 4,707,066 | 11/1987 | Falkenstein et al. | 350/96.20 |
| 4,807,955 | 2/1989 | Ashman et al. | 350/96.2 |

*Primary Examiner*—William L. Sikes
*Assistant Examiner*—Galen J. Hansen
*Attorney, Agent, or Firm*—Leonard Charles Suchyta; Lionel N. White

[57] ABSTRACT

Means for coupling an electrooptical device, such as a semiconductor laser, to an optical fiber avoids heat-induced stresses that commonly result from joining methods employing welding, soldering, or catalytic adhesive compositions. In this invention, the electrooptical device and fiber are firmly mounted within separate elements, such as copper tubes, by means of potting compound or the like, and after close end-to-end supported alignment of the device and fiber elements to obtain optimum light coupling, the assemblage is immersed in an electrolytic plating solution. Plating current is then applied and maintained until a sufficiently strong layer of plating metal encompasses the tubular elements and thereby rigidly fixes the alignment of the device and fiber end at its optimum position. Since the plating operation proceeds in a substantially isothermic environment, there is no misaligning stress introduced which would otherwise degrade the coupling efficiency.

13 Claims, 1 Drawing Sheet

LOW-STRESS COUPLING OF ELECTROOPTICAL DEVICE TO OPTICAL FIBER

BACKGROUND OF THE INVENTION

The present invention provides a means for joining an optical fiber in light coupling alignment with an electrooptical device, such as a semiconductor laser, without the introduction of stresses that invariably result in element misalignment and degradation of coupling efficiency upon subsequent relaxation of such stresses. In particular, the invention provides a method of coupling an optical fiber to an electrooptical light emitter or transducer without employing any of the common practices of welding, soldering, or applying epoxy adhesives, each of which introduces a temperature gradient into the assembly, thereby promoting misalignment stress when the fiber-to-device assembly returns to ambient condition.

Currently, it is common practice to counter post-assembly misalignment, whether caused by stresses induced during assembly or encountered in use from fiber manipulation, by employing relatively massive physical structures to support and join a laser, for example, in simple butt end alignment with an optical fiber light guide. Typical of such structures is that depicted in U.S. Pat. No. 4,199,222. In such an assembly, the laser device is firmly mounted within close tolerance upon a precisely machined base of huge proportion in order to prevent any displacement of the device from a fixed datum. The optical fiber, likewise fixed within a substantial machined support member, is then brought into close alignment with the output laser facet, usually by threaded coupling of its support element with the base upon which the laser is mounted. Despite the great expense and time involved in the precise fabrication and manipulation of the assembly members, however, it is not uncommon that additional lens elements or post-assembly manipulation devices, as typically shown in U.S. Pat. Nos. 4,749,250 and 4,886,337, respectively, are required to obtain an initial optimum alignment for efficient coupling of light from the laser to the fiber. Thereafter, the mass and physical strength of the coupling structure are relied upon to maintain this alignment.

Not only are these prior practices extremely expensive and of questionable effectiveness, but the resulting size of the final coupling assembly, which is not uncommonly orders of magnitude larger than the laser device itself, in effect nullifies the otherwise outstanding advantage to be found in the minute dimensions of a semiconductor laser and prevents any practical application of these devices in multiple-laser arrangements for large scale integrated circuits. The present invention, on the other hand, provides stable and efficient coupling in a structure sufficiently small that the size advantages of the laser itself may be fully realized.

SUMMARY OF THE INVENTION

In the present invention, an electrooptical device is coupled to an optical fiber by mounting each of those elements in separate support members, closely positioning the support members to obtain optimum light coupling alignment between the fiber and the device, and electrolytically plating about the support members a continuous layer of metal of sufficient thickness to retain these members and their affixed fiber and device elements in coupling alignment. By virtue of the fact that the plating process is normally carried out at room temperature and under substantially isothermal conditions, there is little thermal stress developed. The electrolytic plating buildup itself may, by use of any of a number of appropriate known plating solution compositions, be made likewise inherently devoid of a stressing factor which might after completion of the process cause a displacement of the optimum alignment.

Simple end-to-end butt coupling of a single mode optical fiber and a semiconductor laser device, each having a cross-sectional dimension in the range of about 100 to 300 micrometers, may be effectively carried out by means of the invention. These respective elements are initially mounted by means of adhesive, solder, or the like in short lengths of metal tubing, such as a copper tubing of about 0.5 to 2 mm diameter. Although temperature variations may occur in this operation, there is no danger of establishing misalignment stresses, since each of the laser and fiber elements is independent of the other at this stage. The tubular mounting members provide the electrical conductivity needed for the later plating operation and, additionally, provide a convenient conduit in the axial bore through which the fiber and laser power lead may be inserted. The fiber is sealed axially within the bore with a common potting compound which is used to similarly seal the laser power lead in its tube in order to prevent later intrusion of the plating solution.

The tubular support members and their mounted laser and fiber elements may then be brought into butt coupling alignment by means of micrometer control manipulators to obtain the desired light throughput while the laser is in operation. Since the adjacent ends of the supporting tubes are not in tight contact at this stage, a transparent hydrophobic gelling fluid is applied to fill the gap between them and prevent contact of the plating solution with the laser. The resulting gel is sufficiently flexible to allow manipulation of the support tubes if needed to set the final coupling alignment prior to the plating process. In order to enable deposition of a continuous metal layer over the entire aligned tube assembly, a thin coating of electrically conductive material, such as graphite or metal powder, is applied to the exposed gel prior to immersion of the assembly in a metal plating solution. With the assembly wired as the cathode in a typical plating circuit, current is applied for a time sufficient to plate about the aligned support members a circumferential layer of metal approximately 100 to 300 micrometers thick.

The resulting plated coupling is sufficiently rigid to withstand normal handling in circuit assembly operations without significant reduction in light transmission efficiency. In addition to providing stable mechanical support for the coupling alignment of the laser and fiber, the plated layer acts as an effective thermal conduction layer for transmitting the operating heat of the laser out to a heat sink mounting fixture attached to the fiber end of the plated structure.

THE DRAWING

Figure 2:
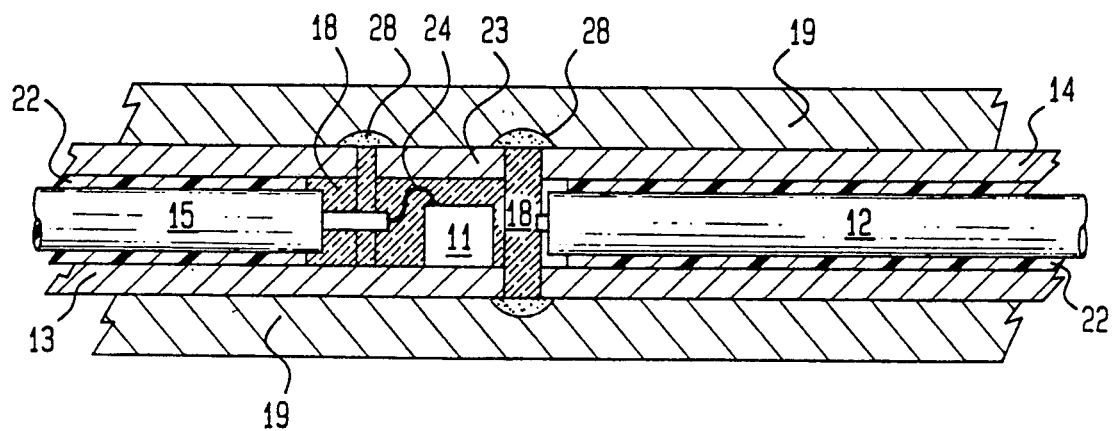

The present invention will be described with reference to the accompanying drawing of which:

FIG. 1 shows an electrolytic plating arrangement for effecting the coupling of electrooptical device and optical fiber support members, according to the invention; and FIG. 2 is a partial cut-away view of juxtaposed device and fiber support members in an embodiment of the coupling of the invention.

DESCRIPTION OF THE INVENTION

An embodiment of the arrangement of principal elements and apparatus for the present invention is generally depicted in FIG. 1. These comprise an electrooptical device, 11, such as an AT&T type 242-A semiconductor laser, affixed to a support member, 13, which may be a length of metal tubing, preferably having high thermal conductivity, e.g. copper, silver, or the like. As noted earlier, the use of such tubing also provides in its bore a convenient means for carrying in laser power lead, 15, and physically stabilizing it with respect to the device. Also included is optical fiber, 12, which is likewise embedded in the bore of tubing, 14.

Each of tubular members, 13, 14, is removably clamped in a supporting arm, 16, of manipulating apparatus, not otherwise shown, by means of which the arms may be moved in three dimensions with micrometer precision. These arms are preferably constructed of metal, such as aluminum or brass, for strength and stability, and also to provide a convenient direct electrical contact with tubing members, 13, 14. Thus, when support arms, 16, are connected to the negative terminal of an electrolytic plating circuit, the entire assembly, including tubing members, 13, 14, become the cathode (−) of the circuit. In order to avoid incidental plating of the support arms and to facilitate ready removal of the final plated coupling structure, the arms are preferably coated with a layer, 17, of dielectric polymer, epoxy, or the like.

With the apparatus thus assembled and with operating power applied to laser, 11, support arms, 16, are adjusted to bring the laser and the exposed polished end of fiber, 12, into close proximity until light throughput is registered by detector means, not shown, attached to the distal end of fiber, 12. Arms, 16, are then precisely manipulated to align the laser output facet and fiber input end in optimum position as indicated at the detector. At this stage in the procedure, the adjacent ends of tubes, 13, 14, are normally separated by a gap which, although only in the range of a few micrometers, is sufficient to allow the intrusion of electrolytic solution during the subsequent plating operation. In order to prevent such intrusion, a small amount of gelling fluid, such as a cureable silicone dielectric composition obtainable as Sylgard 527 from Dow Corning Corporation, Midland Mich., is applied to and fills the gap. After a short exposure to the radiant heat of a lamp, the silicone composition cures to a flexible, adherent, transparent, hydrophobic gel, 18, which completely encapsulates and seals the gap and the exposed laser and fiber elements from plating solution. In addition to its sealant properties, the silicone gel exhibits a refractive index of about 1.4 which, being generally in the range of that of the fiber, mitigates the effect of reflections from the fiber input end. Due to the hydrophobic nature of the protective gel, it is desirable for the purpose of facilitating the later formation of plated metal uniformly over the entire surface of the aligned tubing assembly to apply to its exposed surface a thin coating of an electrically conductive material, such as graphite or metallic paint.

After curing of the gel, a dielectric vessel, 32, containing electrolytic plating solution, 34, is brought into position to immerse the aligned assembly in the solution. The solution preferable comprises ions of a readily platable metal having high thermal conductivity, such as copper, silver, or the like, and may contain other adjuncts normally employed in the electroplating art to promoted plated layers of desirable granularity and tensile strength. In keeping with common plating practices, a replenishment anode (+) member, 36, comprising the metal to be plated is immersed in the solution and electrically connected into the plating circuit. Application of DC plating current in the density range of about 0.1 to 0.5 milliamp per $mm^2$ readily yields, without introducing any misaligning stress, a strong metal layer, 19, of about 150 to 300 micrometer thickness which encases the aligned tubes, 13, 14, to firmly maintain the previously established optimum light coupling alignment between laser, 11, and fiber, 12. After removal from support arms, 16, the completed coupling may be cleaned and made ready for use in a circuit package without physical alignment shift and consequent loss of light output efficiency.

FIG. 2 depicts in greater detail a cross-section of a coupling according to the invention, and shows in particular an embodiment which provides a simplified means of assembling laser, 11, with its support member, 13. In preparing a sample coupling according to this embodiment, a section, 23, of the end of a ten mm length of one mm diameter tube, 13, of half-hard copper was initially removed to provide a shelf onto which laser, 11, would be mounted. Power lead, 15, was then inserted through the bore of the tube, until a bared end of its conductor was accessible at the mounting shelf. The annular space between the inner tube wall and lead, 15, was then filled by capillary action with a low viscosity epoxy composition, 22, such as Epo-Tek 330 available from Epoxy Technology, Inc., Billerica Mass., which was cured to fix lead, 15, in position. Laser, 11, was then affixed to the shelf of tube, 13, with solder to maintain good heat conductivity. Power conductor wire, 24, was connected with solder between laser, 11, and the conductor of power lead, 15, and tube section, 23, was soldered into its original position to provide a protective cover for the laser and the electrical connections.

Optical fiber, 12, was inserted through a similar length of copper tubing in which it was centered while the annular space was likewise filled with epoxy potting composition, 22. It should be noted that although the core of fiber, 12, has been shown for the purpose of illustration in the drawing as extending from the cladding, in actual practice the input end of the whole fiber tube structure was normally polished after completion of the curing of filler composition, 22. Each of support tubes, 13, 14, was then clamped in a support arm, 16. The distal ends of the tubes were in good electrical contact with the support arms and were preferably encompassed by the arm structure in order to prevent unnecessary plating of those ends of the tubes. The proximal ends of tubes, 13, 14, were then moved into end-to-end position and, with the laser powered and emitting, arms, 16, were manipulated by micrometer adjusting means, not shown, to obtain optimum light output from fiber, 12. While this alignment was maintained, small amounts of fluid silicone gelling composition, 18, were introduced into the gaps between the tube ends and between cover section, 23, and the body of tube, 13. Here, also, for the sake of clarity some liberty has been taken with the relative sizes shown in FIG. 2. By capillary action the fluid completely filled the gaps and the remaining interstices between the exposed ends of the filler potting compositions, 22. A few minutes exposure to the radiant heat of a lamp cured the fluid silicone composition to an adherent, flexible, transparent, hydrophobic gel. The exposed surfaces of gel, 18, were then coated with a dispersion of about 10% graphite powder in n-butyl acetate. When air-dried the graphite layer, 28, adhered to gel, 18, and provided continuity of electrical conductivity over the whole surface of the tube assembly. The use of commercial metal powder or graphite dispersions in organic resin binder solutions, such Grapho-223 available from Grapho Colloids Division, Emlenton Pa., also provided satisfactory results.

While the aligned tubes, 13, 14, were maintained in position, a container, 32, of a typical low stress copper plating solution, 34, comprising about 200 gm $CuSO_4 \cdot 5H_2O$ and 60 gm $H_2SO_4$ per liter was brought into place to immerse the tube assembly in the solution. A copper anode, 36, suspended in solution, 34, was electrically connected in circuit with arms, 16, and an adjustable DC current source, not shown. Current was then applied to the plating circuit at about 10 to 20 milliamps with resulting current density of about 0.2 to 0.4 $mA/mm^2$, common for plating operations at ambient temperature. During a one hour plating period, a smooth, continuous layer, 19, of copper deposited to a thickness of about 200 micrometers over the entire surface of the exposed tubing assembly. The overall dimensions of the resulting coupling structure were then about $20 \times 1.5$ mm, smaller by orders of magnitude than previously available laser-to-fiber coupling systems.

Upon completion of the plating operation, the coupling was removed from supports, 16, cleaned of residual plating solution, and tested for light coupling efficiency. With a laser exhibiting a particularly good far-field beam angle (FWHM) of 19° parallel and 25° normal to the junction plane, an efficiency of 14%, as compared with a theoretical maximum of 21%, was obtained. While lower quality laser devices provided somewhat lesser maximum coupling efficiency, there appeared no significant loss of light output through the fiber even after substantial handling such as would be experienced with use in structural applications. On the contrary, some noticeable improvement in the light output was measured when the plated coupling assembly was attached at fiber end, 14, to a metal mounting support. This was apparently due to the effective flow of heat from the laser to the supporting heat sink through the plated layer, 19.

It is anticipated that improvement in the quality of laser devices to provide near circular beams with field angles of less than 10° will greatly increase the utility of butt coupling now made eminently practical by the present invention. In addition, the common implementation of lenses to improve coupling efficiency may no less be employed in the present coupling structure. Some adjustment to the process, such as by maintaining an air space at the surface of a fiber-end lens to ensure proper refraction, would of course suggest itself. In any event, as a result of the described invention the outstanding size advantages of available laser and other electrooptical devices may now be fully enjoyed in telecommunications and like systems without the impediments of relatively enormous coupling structures. System designers are thus now provided with means by which numerous such devices may be practically incorporated with integrated circuitry in applications of vastly reduced scale.

Various other embodiments in addition to the procedures and examples recited and suggested herein will undoubtedly become apparent to the skilled artisan in the light of the foregoing description. Such embodiments are nonetheless to be included within the scope of the present invention as defined by the appended claims.

What is claimed is:

1. A structure for joining an electrooptical device in light coupling alignment with an optical fiber, said structure comprising:
   a) a first support member mounting said device;
   b) a second support member mounting said fiber;
   c) said first and second support members closely positioned with said device and said fiber in light coupling alignment; and
   d) a layer of metal electrolytically deposited about said first and second support members to a thickness sufficient to physically maintain said members in said light coupling position.

2. A structure according to claim 1 wherein:
   a) said first and second support members comprise tubes; and
   b) said electrooptical device and optical fiber are fixed in the respective bores of said tubes.

3. A structure according to claim 2 wherein:
   a) said electrooptical device is a semiconductor laser; and
   b) the power lead for said laser is fixed in the bore of said first support member.

4. A structure according to claim 3 wherein:
   a) said support member tubes are metal; and
   b) said laser is fixed in heat-conductive contact with said first support member.

5. A structure according to claim 4 wherein:
   a) said support members are tubes of copper in the range of 0.5 to 2 millimeters diameter; and
   b) said metal layer is an electrolytic deposit of copper in the range of 150 to 300 micrometers thick.

6. A structure according to claim 4 wherein:
   a) said support member tubes are closely positioned end to end; and
   b) any gap between said laser and said fiber is filled with a transparent material exhibiting an index of refraction in the range of that of said fiber.

7. A structure according to claim 6 wherein said transparent material is a flexible, hydrophobic gel.

8. A method of joining an electrooptical device in light coupling alignment with an optical fiber, said method comprising:
   a) affixing said device within the bore of a first tubular metal support member;
   b) affixing said fiber within the bore of a second tubular metal support member;
   c) closely positioning said support members end-to-end with light coupling alignment between said device and said fiber;
   d) sealing any gap between the juxtaposed ends of said support members to prevent intrusion of electrolytic plating solution between said device and said fiber;
   e) immersing the positioned support members in a body of electrolytic plating solution;
   f) electrically connecting said support members as the cathode in an electrolytic plating circuit; and
   g) applying sufficient plating current to said circuit to deposit about said positioned support members a layer of metal to a thickness sufficient to maintain said members in said light coupling position.

9. A method according to claim 8 wherein said sealing is effected by filling interstices between said device and said fiber with a flexible, transparent, hydrophobic gel.

10. A method according to claim 8 wherein said current is applied at a density in the range of about 0.1 to 0.5 milliamps per mm$^2$ for a time sufficient to deposit said metal layer to a thickness in the range of about 150 to 300 micrometers.

11. A structure joining an electrooptical device in light coupling alignment with an optical fiber and comprising plural separate support means to which said device and fiber are respectively mounted and means retaining said support means in fixed position relative to each other to ensure said alignment characterized in that
   a) said support means comprise metal tubes within the bores of which said device and fiber are respectively affixed; and
   b) said retaining means comprises a layer of metal electrolytically deposited about said positioned tubes to a thickness sufficient to physically maintain said mounted device and fiber in said light coupling alignment.

12. A structure according to claim 11 characterized in that
   a) said metal tubes are closely positioned end to end; and
   b) any gap between said laser and said fiber is filled with a transparent material exhibiting an index of refraction in the range of that of said fiber.

13. A structure according to claim 12 characterized in that
   a) said support tubes are copper;
   b) said electrooptical device is a semiconductor laser in heat conductive contact with its support tube;
   c) said transparent material is a flexible, hydrophobic gel; and
   d) said metal layer is copper in the range of 150 to 300 micrometers thick.

* * * * *